United States Patent
Manepalli et al.

(10) Patent No.: US 9,165,914 B2
(45) Date of Patent: Oct. 20, 2015

(54) FORMING DIE BACKSIDE COATING STRUCTURES WITH CORELESS PACKAGES

(71) Applicant: Intel Corporation, Santa Clara, CA (US)

(72) Inventors: Rahul N. Manepalli, Chandler, AZ (US); Mohit Mamodia, Chandler, AZ (US); David Xu, Chandler, AZ (US); Javier Soto Gonzalez, Chandler, AZ (US); Edward R. Prack, Phoenix, AZ (US)

(73) Assignee: Intel Corporation, Santa Clara, CA (US)

(*) Notice: Subject to any disclaimer, the term of this patent is extended or adjusted under 35 U.S.C. 154(b) by 246 days.

(21) Appl. No.: 13/895,546

(22) Filed: May 16, 2013

(65) Prior Publication Data

US 2013/0252376 A1   Sep. 26, 2013

Related U.S. Application Data

(62) Division of application No. 12/972,161, filed on Dec. 17, 2010, now Pat. No. 8,466,559.

(51) Int. Cl.
| | |
|---|---|
| *H01L 25/00* | (2006.01) |
| *H01L 23/498* | (2006.01) |
| *H01L 23/538* | (2006.01) |
| *H01L 25/065* | (2006.01) |
| *H01L 23/00* | (2006.01) |

(52) U.S. Cl.
CPC .......... *H01L 25/50* (2013.01); *H01L 23/49816* (2013.01); *H01L 23/5389* (2013.01); *H01L 24/24* (2013.01); *H01L 25/0657* (2013.01); *H01L 2225/06527* (2013.01); *H01L 2924/10523* (2013.01)

(58) Field of Classification Search
CPC ... H01L 23/481; H01L 25/0657; H01L 25/50; H01L 31/18; H01L 31/05; H01L 21/76898; H01L 2224/16145; H01L 2224/32225; H01L 2224/73204; H01L 24/16; H01L 2225/06541
See application file for complete search history.

(56) References Cited

U.S. PATENT DOCUMENTS

| | | | |
|---|---|---|---|
| 6,780,733 | B2 | 8/2004 | Chason et al. |
| 7,576,434 | B2 | 8/2009 | Mancera et al. |
| 7,591,067 | B2 | 9/2009 | Wang |
| 8,067,695 | B2 | 11/2011 | Kaneko |

(Continued)

FOREIGN PATENT DOCUMENTS

| | | |
|---|---|---|
| WO | 2012/082431 A2 | 6/2012 |
| WO | 2012/082431 A3 | 9/2012 |

OTHER PUBLICATIONS

International Search Report and Written Opinion Received for PCT Patent Application No. PCT/US2011/063259, Mailed on Jul. 31, 2012, 9 pages.

(Continued)

*Primary Examiner* — Roy Potter
(74) *Attorney, Agent, or Firm* — Winkle, PLLC

(57) ABSTRACT

Methods of forming a microelectronic packaging structure and associated structures formed thereby are described. Those methods may include attaching a patterned die backside film (DBF) on a backside of a die, wherein the patterned DBF comprises an opening surrounding at least one through silicon via (TSV) pad disposed on the backside of the die.

12 Claims, 12 Drawing Sheets

(56) References Cited

U.S. PATENT DOCUMENTS

| | | |
|---|---|---|
| 2006/0108691 A1* | 5/2006 | Kameyama et al. .......... 257/758 |
| 2007/0181995 A1 | 8/2007 | Hsu et al. |
| 2007/0289127 A1 | 12/2007 | Hurwitz et al. |
| 2008/0185710 A1 | 8/2008 | Hsuan et al. |
| 2008/0290507 A1 | 11/2008 | Park et al. |
| 2008/0315391 A1 | 12/2008 | Kohl et al. |
| 2009/0021974 A1 | 1/2009 | Nonomura et al. |
| 2009/0079064 A1 | 3/2009 | Tang et al. |
| 2009/0294916 A1 | 12/2009 | Ma et al. |
| 2010/0309704 A1 | 12/2010 | Dattaguru et al. |
| 2012/0153494 A1 | 6/2012 | Manepalli et al. |

OTHER PUBLICATIONS

International Preliminary Report on Patentability and Written Opinion received for PCT Patent Application No. PCT/US2011/063259, mailed on Jun. 27, 2013, 6 pages.

* cited by examiner

FORMING DIE BACKSIDE COATING STRUCTURES WITH CORELESS PACKAGES

RELATED APPLICATIONS

The present application is a Divisional of U.S. application Ser. No. 12/972,161 filed Dec. 17, 2010, entitled "SINGLE TRANSISTOR DRIVER FOR ADDRESS LINES IN A PHASE CHANGE MEMORY AND SWITCH (PCMS) ARRAY".

BACKGROUND OF THE INVENTION

As semiconductor technology advances for higher processor performance, advances in packaging architectures may include coreless bumpless build-up Layer (BBUL) package architectures and other such assemblies. Current process flows for BBUL packages involve building of the substrate on a temporary core/carrier capped with copper foil, which may then be removed after the package is separated from the core.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

Figure 1A:
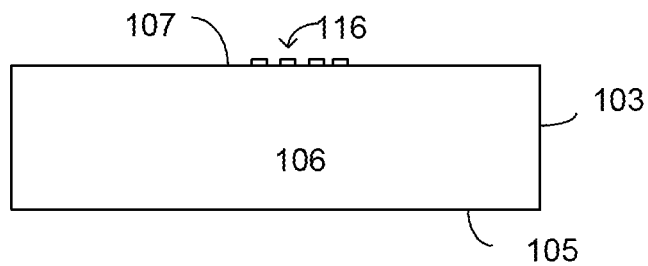
FIGS. 1a-1o represents methods of forming structures according to various embodiments.

In the following detailed description, reference is made to the accompanying drawings that show, by way of illustration, specific embodiments in which the methods may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing a microelectronic structures, such as package structures, are described. Those methods may comprise attaching a patterned die backside film (DBF) on a backside of a die, wherein the patterned DBF comprises an opening surrounding at least one through silicon via (TSV) pad disposed on the backside of the die. The various embodiments included herein enable integration of thin flexible BBUL packages with TSV system on chip (SOC) and stacked memory die. The embodiments provide methods for easy access to TSV pads while enabling a high yielding, low die crack BBUL process, for example.

Figure 1B:
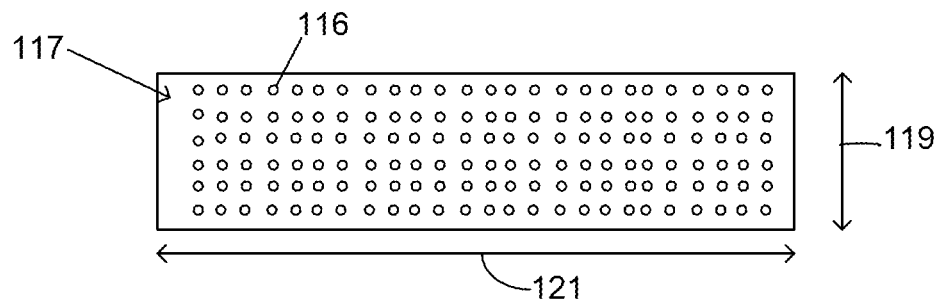
Figure 1C:
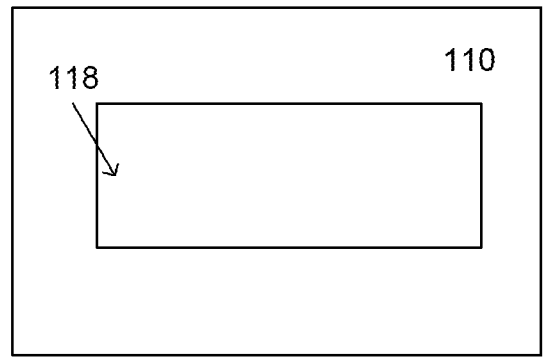
Figure 1D:
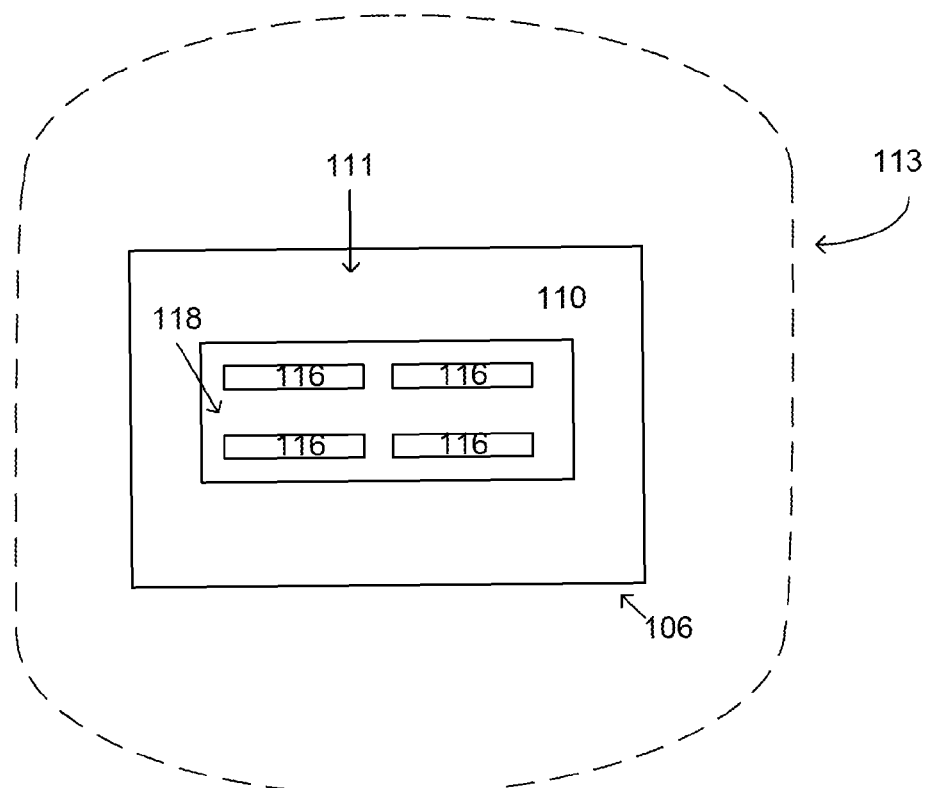
Figure 1E:
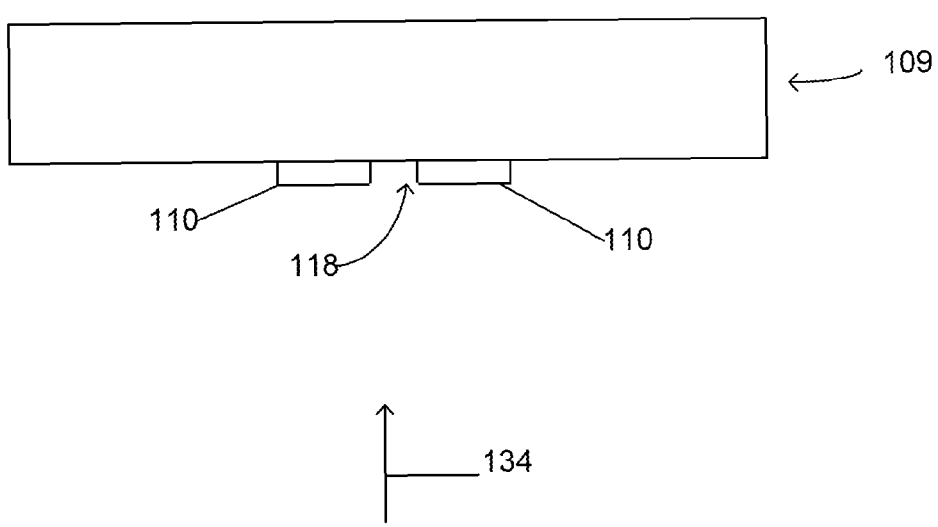
Figure 1F:
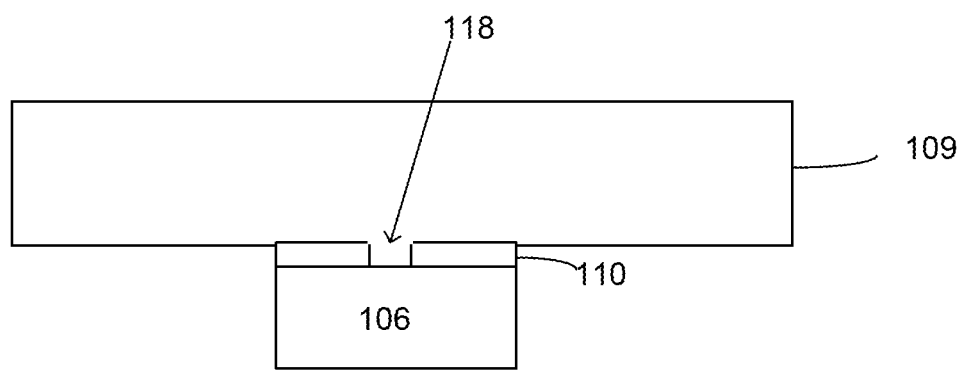
Figure 1G:
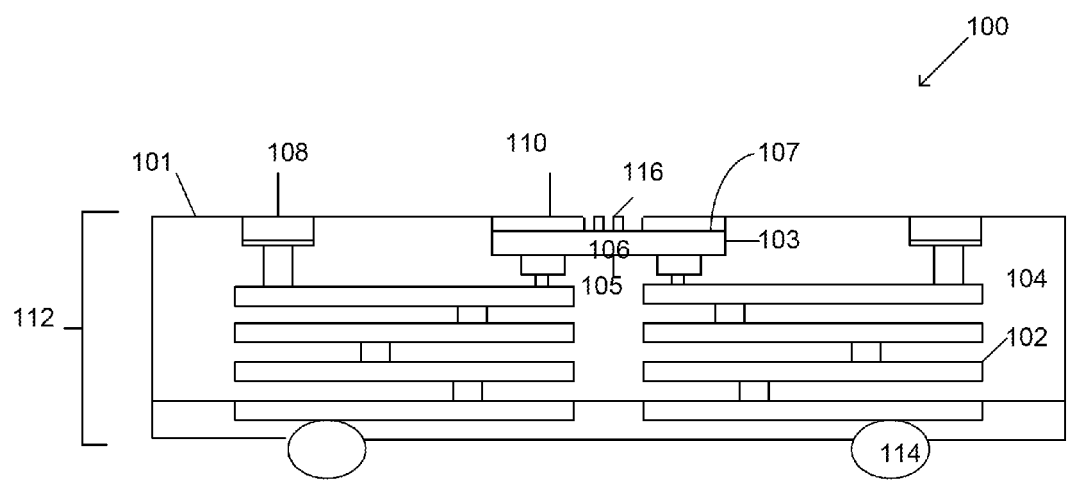
Figure 1H:
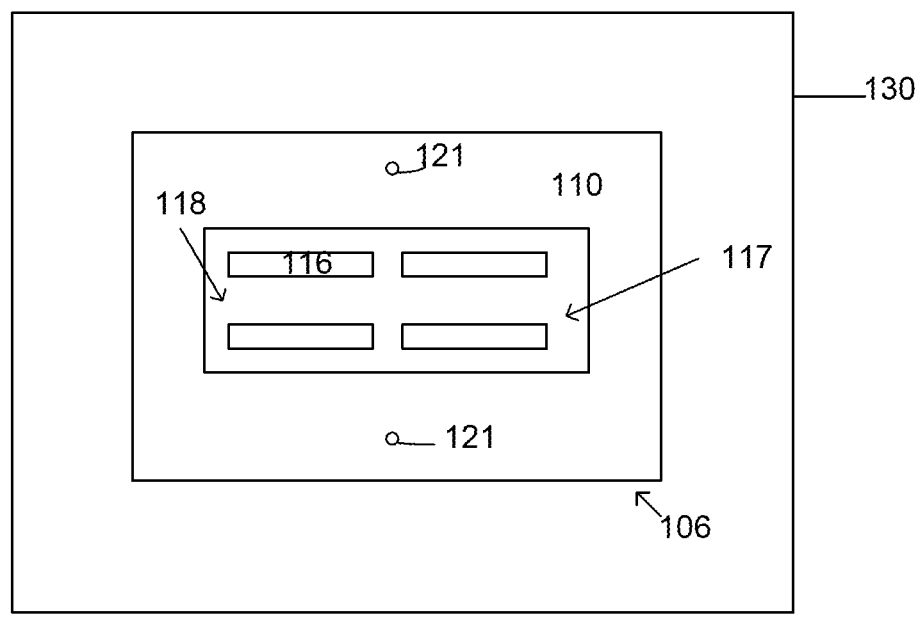
Figure 1I:
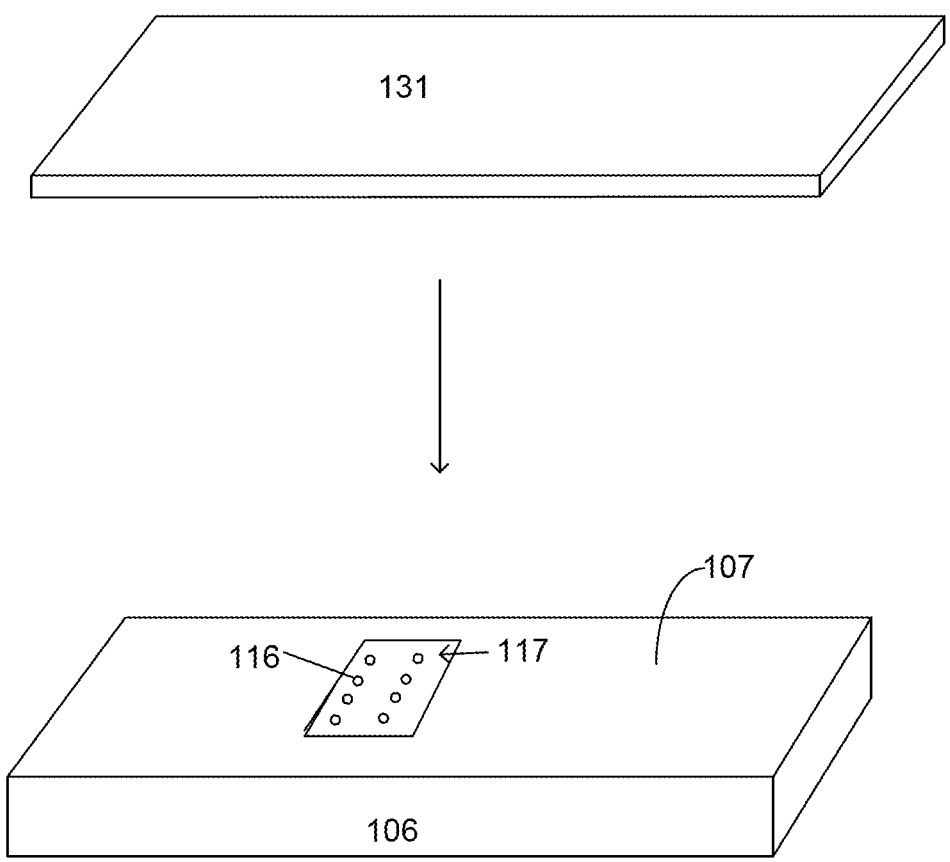
Figure 1J:
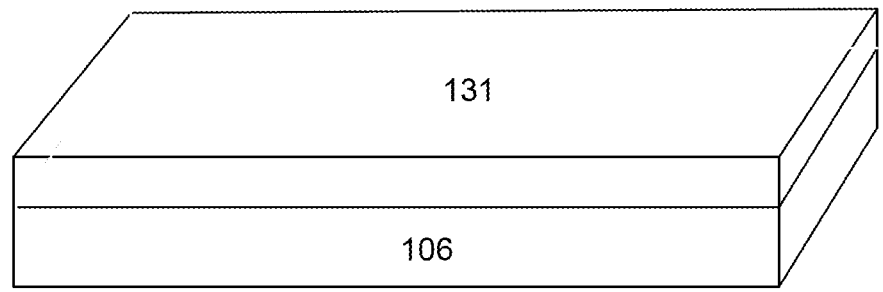
Figure 1K:
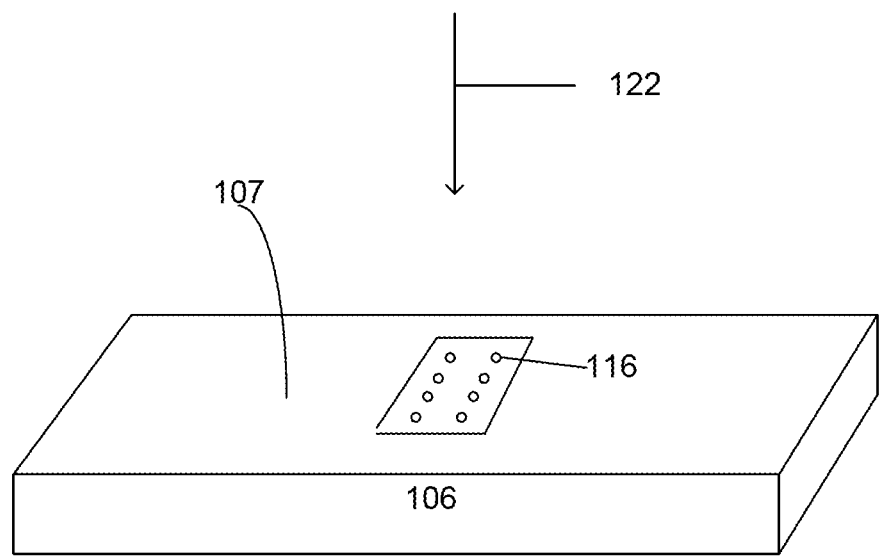
Figure 1I:
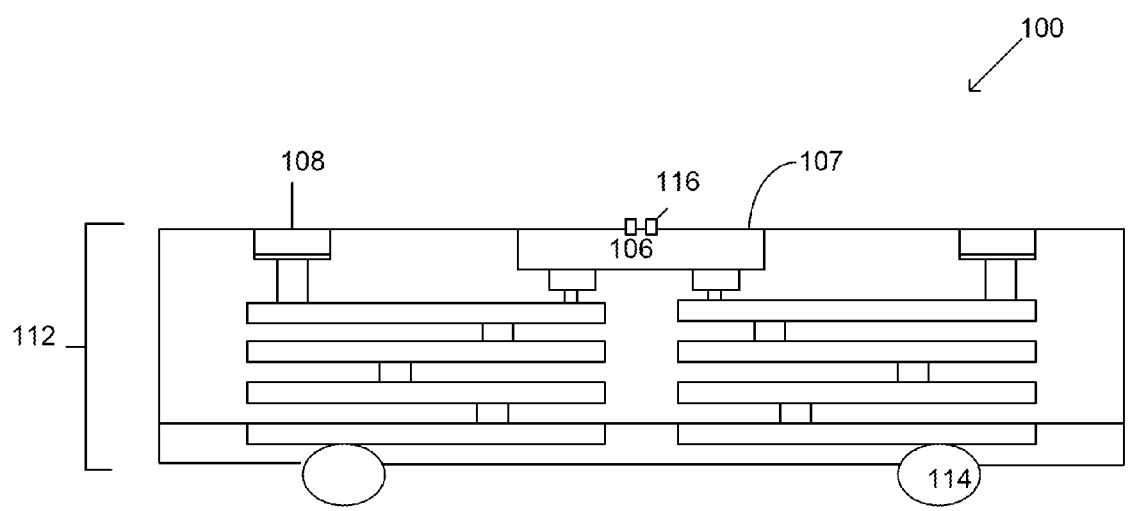
Figure 1M:
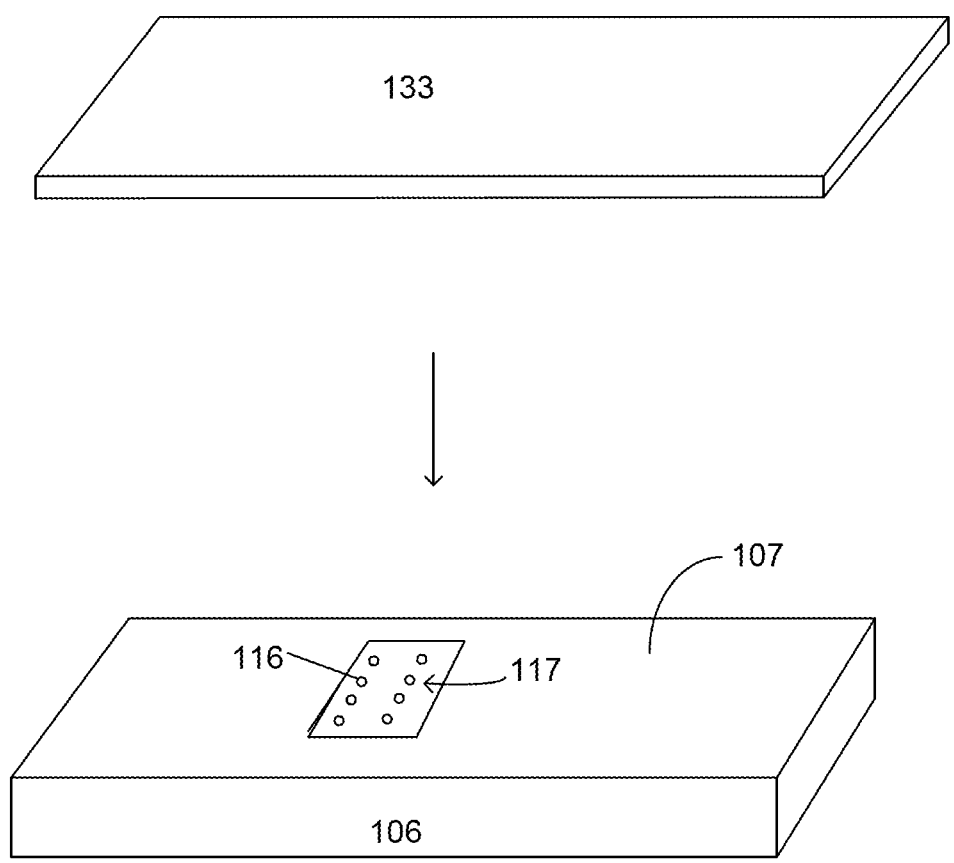
Figure 1N:
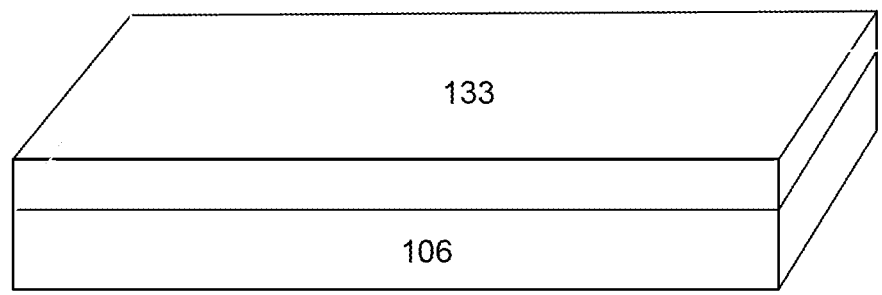
Figure 1O:
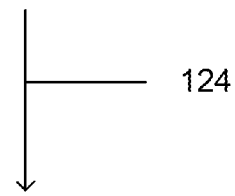
Figure 1O:
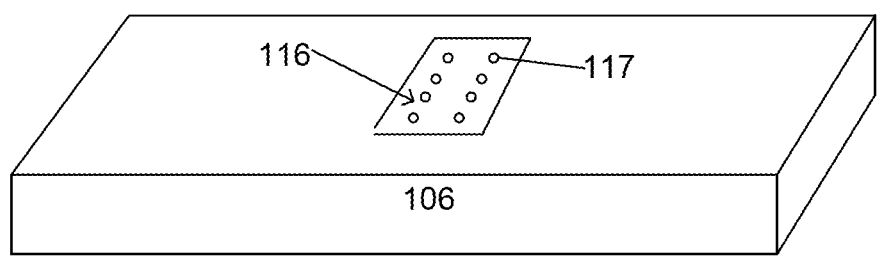

FIGS. 1a-1o illustrate embodiments of methods of forming microelectronic structures, such as package structures, for example. In an embodiment, a die 106 may comprise a thin die 106, and may comprise a thickness of below about 150 microns, and may comprise a bare die in some cases (FIG. 1a). In an embodiment, the die 106, such as a microelectronic die 106, for example, may comprise at least one sidewall 103, a back side 107 and an active side 105. The die 106 may comprise at least one TSV pad 116 disposed on the die 106 backside 107. Such microelectronic architectures using TSV pads 116 disposed on the backside 107 of the die 106 may include system on chip (SOC) dies, for example. In an embodiment, the TSV pads 116 may comprise a plurality and/or an array of TSV pads 116. For example, an array 117 of TSV pads 116 may comprise a width 119 and a length 121 (FIG. 1b). In an embodiment, the width 119 may comprise about 200 microns and the length 121 may comprise about 2,000 microns.

FIG. 1c depicts a top view of a die backside film (DBF) 110. In an embodiment, the DBF 110 may be patterned to create at least one opening 118 in the DBF 110. The opening 118 may be formed/patterned in the DBF 110 to provide an opening for the TSV pads 116 (so that they are not covered by the DBF 110) when the DBF 110 is placed onto the backside 107 of the die 106 during subsequent processing of the die 106, to be further described herein. The DBF 110, which may comprise an adhesive film, can be used as a permanent part of a final package structure utilizing the die 106 to protect the backside 107 of the die 106, and/or to provide a surface for marking, and/or to manage any warpage that may occur within the die 106, for example.

In an embodiment, the DBF 110 may be applied to the back side 107 of the die 106 prior to building up layers of a microelectronic package structure. The DBF 110 may attach the die 106 to a sacrificial copper panel, such as the panel structure 109 of FIG. 1e, for example, upon which various buildup layers of a package structure may subsequently be formed. One purpose of the DBF 110 is to create a good adhesive bond between the die 106 and a sacrificial copper panel in order to facilitate a substrate build up process on top of the die 106.

In an embodiment, the pre-patterned DBF 110 can be applied onto the backsides 107 of a plurality of die 106 while the die are present in wafer 113 form (FIG. 1d, top view, showing enlarged view of one die 106 of the plurality). (In another embodiment, an un-patterned DBF 110 may be patterned after placement onto the wafer 113). The patterned DBF 110 can be applied to the plurality of die 106 within the wafer 113 with minimal alignment to ensure alignment of the DBF openings 118 with the TSV pads 116 disposed on the backside 107 of the die 106, in an embodiment, so that the TSV pads 116 may be exposed. Thus, after the DBF 110 is applied to the backside 107 of the die 106, the backside 107 of the die 106 may comprise a DBF 110 covered region 111 and a region within the opening 118 wherein the TSV pads 116 are exposed on the backside 107 of the die 106. In an embodiment, the TSV pad's 116 relative area as compared with the overall die 106 area may be relatively small. In an embodiment, the TSV pad 116 area may comprise less than about five percent of the area of the die 106 (i.e. FIG. 1d drawing may not be to scale). Thus, in an embodiment, the DBF 110 may be placed on the backside 107 of the die 106 prior to attaching the die 106 to the panel structure.

In another embodiment, the adhesive DBF 110 can be applied to a panel structure 109, such as a BBUL panel structure 109, and opening 118 may be formed in the DBF 110 while disposed on the panel structure 109 (FIG. 1e). In an embodiment, the opening 118 may be formed by using a laser ablation tool/process 134, for example. The die 106 may then be placed onto/attached to the DBF 110 comprising the opening 118 that is disposed on the panel structure 109 (FIG. 1f). The die 106 can be placed onto the patterned DBF 110 with minimal alignment to ensure alignment of the DBF openings 118 with the TSV pads 116 (not shown) disposed on the backside 107 of the die 106, in an embodiment, so that the TSV pads 116 may be exposed, i.e. not covered by the DBF 110.

In an embodiment, a build up process may be employed such that build up layers 112 may subsequently be formed on the panel structure 109 adjacent the die 106, to form a package structure, such as the package structure 100 of FIG. 1g, for example (shown after panel removal). In an embodiment, the die 106 comprising the DBF 110 disposed on the backside 107, wherein the opening 118 in the DBF 110 exposes the TSV pads 116, may be disposed within the package structure 100, such as within a dielectric layer 104 of the package structure 100. In an embodiment, the die 106 maybe fully embedded in the coreless package structure 100.

The package structure 100, which may comprise a BBUL package, for example, may comprise at least one conductive interconnect structure 102. The at least one conductive interconnect structure 102 may comprise conductive metal layers in an embodiment. The package structure 100 may further comprise package on package (PoP) pads 108, wherein a top portion of the PoP pad 108 may be exposed and co-planar with a top surface 101 of the package structure 100. In an embodiment, the package structure 100 may comprise a series of dielectric build up layers, via's, and electroplated lines that may be built upon the panel structure 109 (before its removal), and may further comprise solder interconnect structures 114.

In some prior art package structures, TSV structures disposed on the die backside may be covered with the DBF material, hence preventing access/coupling to the TSV pads with other dies, interconnect structures etc. Some other prior art methodologies may remove the DBF material by using plasma/laser and/or wet abrasive blasting post BBUL processing to expose the die and the TSV pads. However the impact of such aggressive processing on damage to silicon die and to fragile TSV pads may provide a deleterious effect on yield and reliability. Thus, the various embodiments included herein enable access to the TSV pads 116 on the backside of the die 106, while enabling a high volume, high yield packaging, such as BBUL packaging, fabrication process.

The DBF 110 may comprise various thermoset chemistries, in an embodiment. The choice of the adhesive type of the DBF 110 material becomes important since the DBF 110 material needs to survive the substrate build up process, which may include exposure to high temperatures during curing cycles, exposure to acids, bases and solvents used for plating etching and solvent stripping etc. Highly cross-linked, cured thermosetting epoxies may be used to maintain stability of the die-panel connection during subsequent BBUL processing steps.

Since the area of the TSV pad's 116 relative the overall die 106 area is relatively small (less than about 10 percent or 5 percent in some cases), the impact of the opening 118 in the DBF 110 (to expose the TSV pads 116) on the die 106 to panel 109 adhesion is minimal. Further, by utilizing the various embodiments included herein, damage to underlying silicon portions of the die and to thin TSV pads under the DBF 110 may be minimized by avoiding caustic prior art DBF removal processing, The creation of the pre-patterned DBF's of various embodiments herein can successfully enable the fabrication of the BBUL packages and yet enable access to the TSV pads without the use of aggressive prior art DBF removal processes. In addition, presence of the DBF on the remainder of the die can also act as a crack protection film to prevent crack initiation arising from either poor handling or attach processing, such as TCB (thermal compression bonding) attachment/coupling of a second die, such as a memory die for example, to the package 100 comprising the die 106.

For example, FIG. 1h depicts a top view of a second die 130, such as a memory die 130, for example, disposed on the die 106, which may comprise a SOC die 106, for example. TSV pads 116 of the die 106 may be disposed within the opening 118 in the DBF 110 to allow access/coupling to interconnect structures within the second die 130. In an embodiment, TSV structures 116 of the die 106 may be aligned with TSV structures (not shown) of the second die 130.

Figure 2:
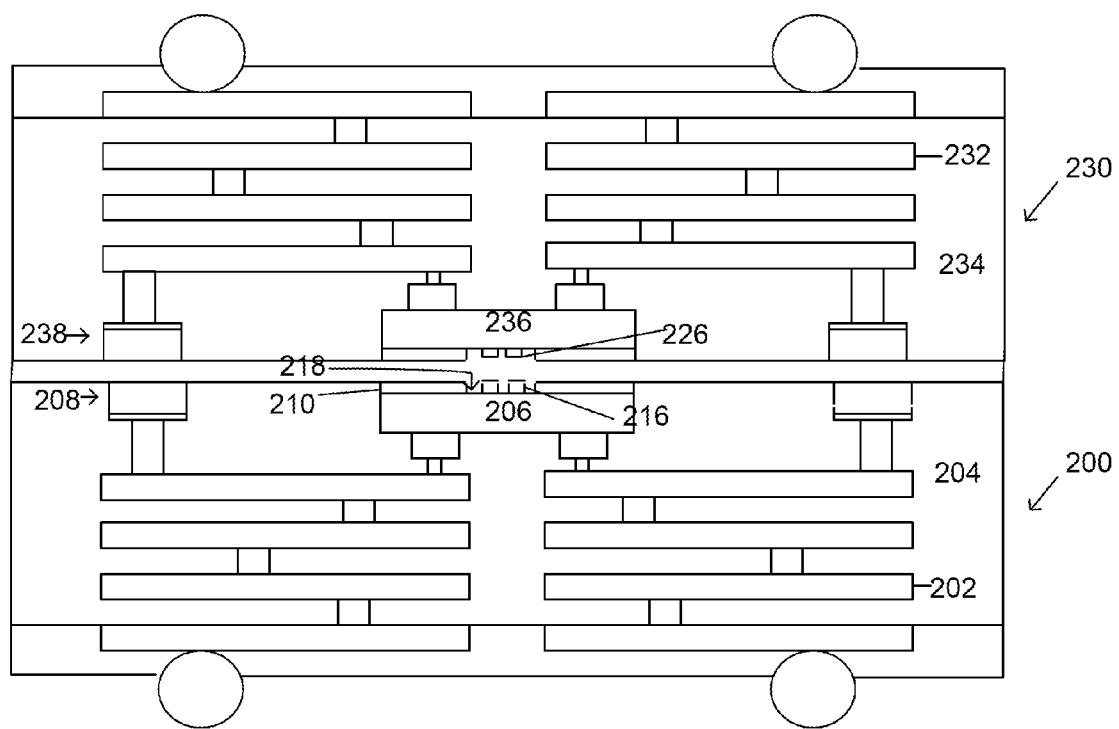
FIG. 2 represents a structure according to embodiments.

In an embodiment, a mechanical support array of bumps 121 may be disposed along a center line of the die 106, and may be disposed in a center portion of the TSV 116 array 117. FIG. 2 depicts a cross sectional view of at least one TSV pad 216 of a first die 206 disposed in a BBUL package 200 that may be disposed within an opening 218 in a DBF 210 to allow access/coupling to interconnect structures, and/or at least one TSV pads 226 of a second die 236 disposed in a second package 230. The first package 200 may comprise dielectric regions 204, interconnect structures 202 and PoP pads 208, and the second package 230 may comprise dielectric regions 234, interconnect structures 232 and PoP pads 238.

In an embodiment, the second die 236 may or may not comprise a patterned DBF material on the backside of the second die 236. In an embodiment, the at least one TSV pad 216 of the first die may be aligned to the at least one TSV pad 226 disposed on the backside of the second die 236. In an embodiment, the BBUL package 200 attached to the second package 230 may comprises a portion of a stacked package structure. In an embodiment, the first die 206 may comprise a central processing unit (CPU) die and the second die 236 may comprise one of a flash memory die, a dynamic random access memory (DRAM) die and a static random access memory (SRAM) die.

In an embodiment, the second die 236 may comprise a thin memory die, and for example may comprise a thickness of less than about 150 microns. In an embodiment, the PoP pads 208 of the first package 200 may couple to the second package 230, and may couple to the PoP pads 238 of the second package 230. In an embodiment, the coupling may be achieved by TCB methods, for example wherein the PoP pads 208, 238 of the respective packages 200, 230 may be compressed together to be in physical contact with each other.

In another embodiment (referring back to FIGS. 1i-1j), an un-patterned DBF 131 may be placed on the die 106 comprising the array 117 of TSV pads 116 on the backside 107 of the die 106. The un-patterned DBF 131 material may be applied to the die 106 backside 107 at either the wafer level or the panel level, in a similar manner as shown in FIGS. 1d-1e, for example. In an embodiment, the un-patterned DBF 131 may comprise a formulation designed to be easily removed by solvents/chemicals to eliminate prior art mechanical DBF removal processes (e.g. sand-blasting etc.), which act as a source of defects to underlying silicon die 106 and TSV pad structures 116.

In an embodiment, the un-patterned DBF 131 may comprise a material that can survive the BBUL substrate build-up process and then be able to be removed after the panel structure is removed from the die 106, such as after a copper etch removal step to remove the panel structure. One of the biggest challenges in the DBF 131 removal process is the impact to the TSV pads 116. The prior art mechanical processes of removal, such as sand-blasting can easily damage the TSV pads 116. In an embodiment, the un-patterned DBF 131 material may comprise various thermoplastic materials, for example, that may be removed/dissolved using less aggressive solvents, i.e. solvents that may not attack/damage the underlying TSV pads 116 and die 106 silicon areas. In an embodiment, the un-patterned thermoplastic DBF 131 material may comprise an acrylic rubber material.

Prior art DBF materials may comprise thermoset materials, in general, and may be based on epoxy resins that are highly cross-linked and which may comprise fillers. These cross-linked organic systems tend to remain stable in the presence of solvents and thus cannot easily be dissolved or removed. By using an alternate DBF chemistry, i.e. by using a thermoplastic chemistry, as in the various embodiments included herein, the un-patterned DBF 131 may be removed from the die 106 backside 107 using a chemical removal process 122 using less aggressive solvents such as Toluene, ethanol and Iso-Propyl Alcohol, for example so that the at least one TSV structures 116 may be accessible/exposed (FIG. 1k). During the removal process 122, elevated temperatures (up to about 180 degrees, in some cases), can optionally be used to achieve a cleaner and more residue free surface.

In an embodiment, the un-patterned DBF 131 may not comprise fillers in order to promote easy removal of the un-patterned DBF 131 from the die 106 backside 107. The thermoplastic un-patterned DBF 131 may comprise a minimum level of cross-linking to provide thermal stability, while surviving substrate build-up processing. After the un-patterned DBF 131 comprising thermoplastic material is removed from the backside 107 of the die 106, the TSV structures 116 may be accessible to a second die that may be placed onto the die 106.

FIG. 1l depicts the die 106 after a substrate buildup process, such as after a BBUL substrate build up process, and after the panel and un-patterned thermoplastic DBF 131 has been removed, utilizing the chemical process 122 of FIG. 1k. The TSV structures 116 disposed on the backside 107 of the die may now be accessible to couple to a second die (and/or package/interconnect structures as well), such as a memory die for example, that may be placed onto the die 106 during subsequent processing steps. The un-patterned DBF 131 has been substantially completely removed from the backside 107 of the die 106. The die 106 is disposed within a BBUL substrate 100, comprising build up layers 112, solder interconnect structures 114 and PoP lands 108.

Thus, embodiments enable methods for easily removing un-patterned DBF 131 to expose die backside TSV structures without damage to such TSV structures and die silicon. Little to no damage may be produced in the die backside after DBF removal. Prior art DBF removal processes produce damage of die backsides where the DBF is removed at the end of the process by sand-blasting, for example.

In another embodiment, an un-patterned DBF 133 may be placed on the backside 107 of the die 106 (FIGS. 1m-1n) comprising the array 117 of TSV pads 116 on the backside 107 of the die 106. The un-patterned DBF 133 material may be applied to the die 106 backside 107 at either the wafer level or the panel level, in a similar manner as shown in FIGS. 1d-1e, for example.

In an embodiment, the un-patterned DBF 133 material may comprise a sacrificial adhesive/polymer that may be used to cover the TSV pads 116 during a substrate build up process, and can then be thermally sublimed after package build up processing is completed. Prior art DBF removal processes typically involve solvents/chemicals and/or mechanical methods such as sand blasting etc. to achieve DBF removal. Such prior art DBF removal processes may act as a source of defect formation to underlying silicon die 106 and TSV pad structures 116.

In an embodiment, the DBF material 133 may be placed on the entire backside 107 surface of the die 106 or in area just around the TSV pads 116. In an embodiment, the DBF material 133 may comprise a polymeric material, such as poly alkylene carbonates, for example, and may include poly propylene carbonate and poly ethylene carbonate, for example. The DBF material 133 may substantially completely decompose at elevated temperatures. For example, the sacrificial DBF 133 may be exposed to a thermal process 124 to remove the sacrificial DBF 133 from the backside 107 of the die 106, thus exposing the TSV structures 116 on the backside 107 of the die 106 with little to no damage to the TSV pads 116 and die 106 backside 107 surface (FIG. 1o). In an embodiment, the temperature of the thermal process 124 may comprise about 200 degrees Celsius or below, wherein the sacrificial DBF 133 may substantially completely decompose during the thermal process 124.

A package comprising the die 106 (similar to the package 100 in FIG. 1l, for example), such as a BBUL package, can be exposed to the thermal process 124 after substrate buildup to sublime the sacrificial DBF material 133 material completely from the die 106 backside 107 and thus expose the TSV pads 116 for attachment/bonding to other structures, such as to a second memory die, for example. In an embodiment, the TSV connection pad area 116 may be recessed and clear after sacrificial DBF 133 removal.

Figure 3:
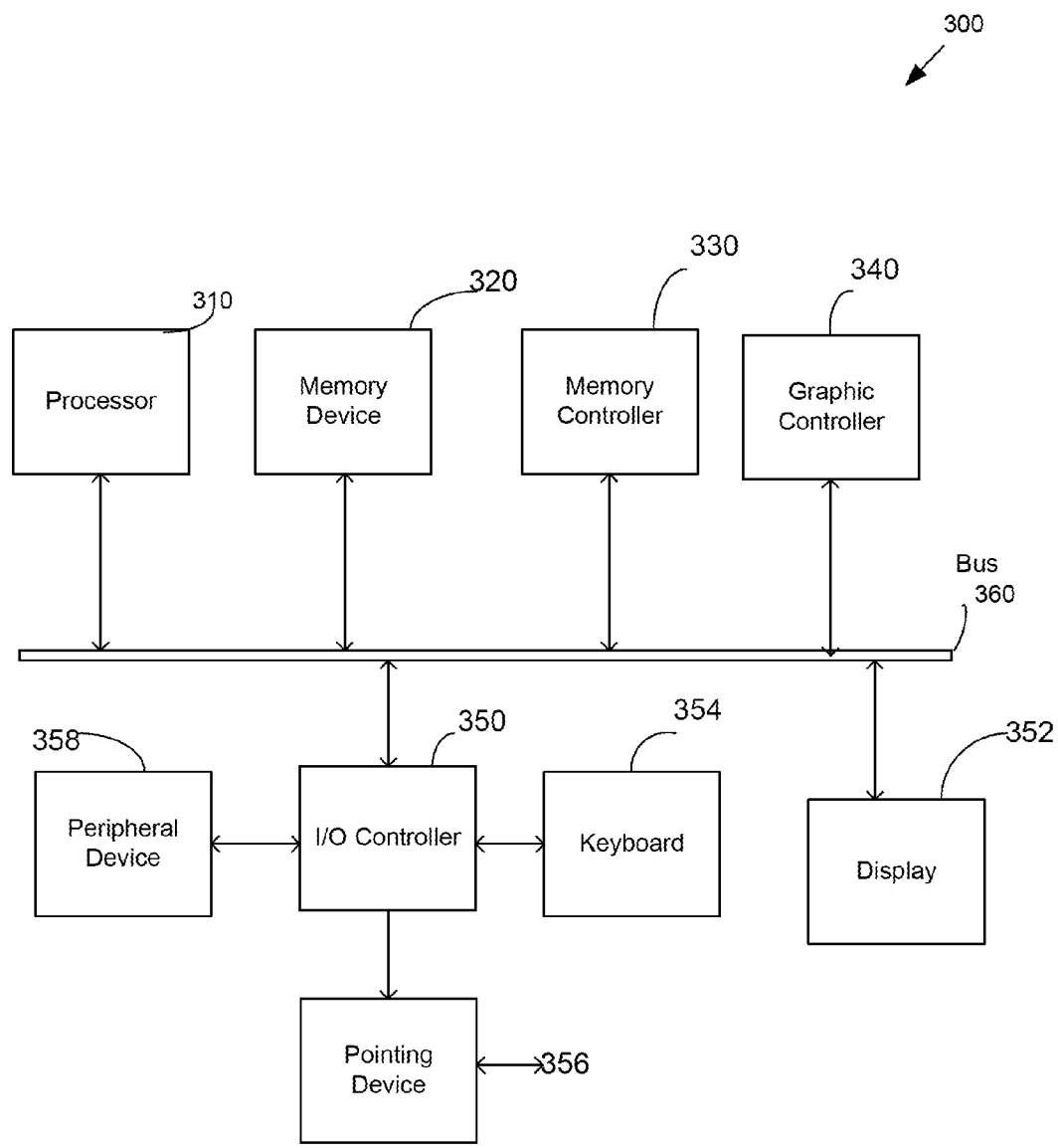
FIG. 3 represents a system according to embodiments.

FIG. 3 shows a computer system according to an embodiment of the invention. System 300 includes a processor 310, a memory device 320, a memory controller 330, a graphics controller 340, an input and output (I/O) controller 350, a display 352, a keyboard 354, a pointing device 356, and a peripheral device 358, all of which may be communicatively coupled to each other through a bus 360, in some embodiments. Processor 310 may be a general purpose processor or an application specific integrated circuit (ASIC). I/O controller 350 may include a communication module for wired or wireless communication. Memory device 320 may be a dynamic random access memory (DRAM) device, a static random access memory (SRAM) device, a flash memory device, or a combination of these memory devices. Thus, in some embodiments, memory device 320 in system 300 does not have to include a DRAM device.

One or more of the components shown in system 300 may be included in/and or may include one or more integrated circuit packages, such as the package structures of the various embodiments herein, such as those depicted in FIGS. 1g, 1l and FIG. 2, by illustration and not limitation. For example, processor 310, or memory device 320, or at least a portion of I/O controller 350, or a combination of these components may be included in an integrated circuit package that includes at least one embodiment of a structure, such as the various packaging structures presented herein, described in the various embodiments.

These elements perform their conventional functions well known in the art. In particular, memory device 320 may be used in some cases to provide long-term storage for the executable instructions for a method for forming packaged structures in accordance with embodiments of the present invention, and in other embodiments may be used to store on a shorter term basis the executable instructions of methods for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 320 may supply the processor 310 with the executable instructions for execution.

System 300 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments enable means to integrate thin flexible BBUL packages with TSV SOC chip and stacked memory die. The embodiments provides methods for easy access to TSV pads while enabling a high yielding, low die crack BBUL process. For example, various embodiments provide simple, high volume manufacturing compatible processes for assembling a BBUL package with the use of patterned DBF films. Embodiments provide methods for fabricating high yield, highly reliable BBUL package structures that can integrate seamlessly with TSV memory stacking on top of CPU packages, for example. Embodiments enable stacking of thin memory die on top of SOC processer die thru TSV interconnects.

Embodiments enable elimination of die crack in thin packages. Embodiments provide packaging, assembly, and/or test solutions/applications for CPU's/processors, chipsets, graphics devices, wireless devices, multi-chip/3D packages including CPU in combination with other devices such as memory (e.g., flash/DRAM/SRAM/etc.) and boards (e.g., motherboards, etc.).

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, it is appreciated that various microelectronic structures, such as general package structure features, are well known in the art. Therefore, the Figures provided herein illustrate only portions of an exemplary microelectronic device that pertains to the practice of the embodiments. Thus the embodiments are not limited to the structures described herein.

What is claimed is:

1. A method comprising;
   attaching a patterned die backside film (DBF) on a backside of a die, wherein the patterned DBF comprises an opening surrounding at least one through silicon via (TSV) pad disposed on the backside of the die;
   attaching the die to a panel structure; and
   building up a BBUL substrate on the panel structure.

2. The method of claim 1 further comprising removing the panel structure from the BBUL package, wherein the patterned DBF remains on the backside of the die.

3. The method of claim 2 further comprising attaching a second die to the die, wherein the at least one TSV pad of the die is aligned to at least one TSV pad disposed on the second die.

4. The method of claim 1 further comprising wherein the DBF is attached to the backside of the die at a panel level.

5. The method of claim 1 further comprising wherein the opening comprises less than about 10 percent of the die area.

6. The method of claim 3 further comprising wherein the BBUL package comprises a portion of a stacked package structure.

7. The method of claim 1 further comprising wherein the opening exposes the at least one TSV pad and wherein the DBF covers a remaining portion of the die.

8. A method comprising;
   attaching one of a thermoplastic DBF material and a sacrificial DBF material on a backside of a die, wherein the sacrificial DBF volatizes at a temperature below about 200 Celsius, and wherein the one of the thermoplastic DBF material and the sacrificial DBF material covers at least one TSV pad disposed on the backside of the die;
   attaching the one of the thermoplastic DBF material and the sacrificial DBF material disposed on the backside of the die to a panel structure; and
   building up a BBUL substrate on the panel structure adjacent the die.

9. The method of claim 8 further comprising removing the thermoplastic DBF by using one of toluene, ethanol and iso-propyl alcohol.

10. The method of claim 8 further comprising removing by the sacrificial DBF by heating the DBF disposed on the backside of the die to about 200 degrees Celsius and below.

11. The method of claim 8 wherein the thermoplastic DBF comprises an acrylic rubber without fillers.

12. The method of claim 9 further comprising attaching a second die to the die, wherein the at least one TSV pad of the die is aligned to at least one TSV pad disposed on the second die.

* * * * *